United States Patent [19]

Drumm

[11] Patent Number: 5,436,849
[45] Date of Patent: Jul. 25, 1995

[54] INCREMENTAL LOGIC SYNTHESIS SYSTEM FOR EFFICIENT REVISION OF LOGIC CIRCUIT DESIGNS

[75] Inventor: Anthony D. Drumm, Rochester, Minn.

[73] Assignee: International Business Machines Corporation, Armonk, N.Y.

[21] Appl. No.: 15,567

[22] Filed: Feb. 9, 1993

[51] Int. Cl.$^6$ .............................................. G06F 17/50
[52] U.S. Cl. ................................... 364/490; 364/489; 364/488
[58] Field of Search ........................ 364/488, 489, 490

[56] References Cited

U.S. PATENT DOCUMENTS

| | | | |
|---|---|---|---|
| 4,493,045 | 1/1985 | Hughes, Jr. | 364/488 |
| 4,583,169 | 4/1986 | Cooledge | 364/488 |
| 4,612,618 | 9/1986 | Pryor et al. | 364/490 |
| 4,636,966 | 1/1987 | Yamada et al. | 364/491 |
| 4,703,435 | 10/1987 | Darringer et al. | 364/489 |
| 4,805,113 | 2/1989 | Ishii et al. | 364/491 |
| 4,827,428 | 5/1989 | Dunlop et al. | 364/491 |
| 4,829,446 | 5/1989 | Draney | 364/488 |
| 4,882,690 | 11/1989 | Shinsha et al. | 364/490 |
| 5,003,487 | 3/1991 | Drumm et al. | 364/489 |
| 5,282,147 | 1/1994 | Goetz et al. | 364/489 |

OTHER PUBLICATIONS

E. Cerny and C. Mauras, "Tautology Checking Using Cross–Controllability and Cross–Observability Relations", IEEE, pp. 34–37, 1990.

"*Incremental Logic Synthesis Through Gate Logic Structure Identification*" by T. Shinsha et, IEEE, 1986, pp. 391–397.

"*Establishment of Higher Level Logic Design For Very Large Scale Computer*" by Y. Tsuchiya et al, IEEE, 1986, pp. 366–371.

"*Transform System for Boolean Comparison*", IBM Technical Disclosure Bulletin, vol. 32, No. 10A, Mar. 1990, pp. 148–150.

"*Fully Self–Contained Memory Card Extended Error Checking/Correcting Hardware Implementation*" by Weaver et, IBM Tech. Discl. Bltin, vol. 31, No. 5, 1990, pp. 352–355.

"*Boolean Comparison of Hardware and Flowcharts*", by Smith et al, IBM Journal Res. Develop., vol. 26, No. 1, (1982), pp. 106–116.

Primary Examiner—Vincent N. Trans
Assistant Examiner—Thai Phan
Attorney, Agent, or Firm—Baker, Maxham, Jester & Meador

[57] ABSTRACT

An apparatus and method for incremental logic synthesis that transforms a revised technology-independent electronic digital circuit design into a revised technology-dependent design deviating as little as possible from the original technology-dependent design. The incremental synthesis procedure includes a forward sweep technique where nodes in the revised technology-independent model and the original technology-dependent design are compared to see if they map the same logical function of the inputs common to both designs. A backward sweep technique compares nodes in the revised technology-independent model to the unrevised technology-dependent design to see which outputs common to both map the same logical node functions. Portions of the revised technology-independent model with the same logical function as corresponding parts of the unchanged technology-dependent design are progressively eliminated, reducing the revised technology-independent design to an "increment" that is then conventionally synthesized and merged with the unchanged technology-dependent design to yield the revised technology-dependent design having only the minimal necessary revisions.

12 Claims, 6 Drawing Sheets

ORIGINAL TD DESIGN $M_{21}$

FIG. 4

NEW TI DESIGN $M_{12}$

INCREMENTAL LOGIC SYNTHESIS SYSTEM FOR EFFICIENT REVISION OF LOGIC CIRCUIT DESIGNS

BACKGROUND OF THE INVENTION

1. Field of the Invention

This invention relates to computer-aided design of digital electronic circuits, and more specifically to logic synthesis systems that start with a digital circuit model described in technology-independent terms and automatically generate a logically equivalent circuit model efficiently implemented in terms of a selected device technology.

2. Discussion of Related Art

Logic synthesis systems help reduce the time needed to design digital electronic circuits. Such systems allow designers to express the function of a circuit in logical technology-independent terms; for example, in terms of ANDs, ORs and inverters with unlimited fan-in and fan-out. Such a technology-independent design may include certain redundancies or other inefficiencies that make the design easier to develop and understand. After verification of logical features, the logic synthesis system is then employed to convert this technology-independent design into an optimized technology-specific design that incorporates rules and constraints for a specific digital technology; for example, MOSFET or bipolar technology. Such constraints may dictate the exclusive use of NOR gates with limited fan-in and fan-out, for instance. U.S. Pat. No. 4,703,435 assigned to the assignee hereof describes a logic synthesis system and is entirely incorporated herein by this reference.

The technology-specific output of such a logic synthesis system is further manipulated according to the rules of the selected device technology to yield a final manufacturable circuit design. This further device-specific design work may include such things as laying out the technology-dependent logic elements in an integrated circuit, routing interconnections between these elements, and verifying compliance with device-specific timing constraints. Thus, determining correspondence between signals in the original technology-independence model, signals in the intermediate technology-dependent model and signals in the final circuit layout is generally not possible except at specific boundaries.

After finishing this final device-specific design layout work, logical changes may be made to the original technology-independent model, either to correct errors or to introduce improvements. When this occurs, the logic synthesis system is again employed to generate a new intermediate technology-dependent model from the amended technology-independent model. This redesign is time-consuming. It may also introduce so many changes into the new intermediate technology-dependent design that much of the additional device-specific design work must also be repeated, consuming even more time.

Under many circumstances, the inability to fully relate the internal nodes in the resultant device-specific logic with those in the initial technology-independent logic is not a concern. If the resultant logic satisfies the area and speed criteria of the design and if it performs the required function, the internal signals are not closely evaluated. Automatic Boolean verification can be performed at the boundaries of the two logic models to confirm that they perform identical functions This may be done in any useful manner, such as with the method described by G. L. Smith, et al ("Boolean Comparison of Hardware and Flowcharts", *IBM Journal of Research and Developement*, Vol 26, No. 1, pp. 106-116 (1982)). This verification task can become difficult when the two models are large but difficulties can be minimized by selecting a small number of internal nodes as pseudo-boundary points for use during the verification process.

The changes made during reoptimization of large logic models are too pervasive to permit practical recovery of a change history. Some optimization techniques known in the art may inhibit the use of such history data even if they were available. Also, the global effects of logic changes can drastically alter logic that is seemingly unrelated to the region of the change. These global effects make impossible the reconstruction of a correspondence between the unchanged final device-specific model and the revised final device-specific model. Such global effects are also sometimes undesirable to a designer who, having already analyzed the unchanged portion of the final device-specific design, is satisfied with the results and does not wish those results altered.

Limiting the scope and influence of logic optimization by partitioning appears to be a simple and effective solution to this problem. This increases the likelihood for finding correspondence and isolating changes. Such is the approach taken by mapping systems that make only trivial changes to the model as necessary to meet the technology-specific rules or to eliminate unused circuits. The mapping approach actually diminishes the value of automated logic synthesis and burdens the logic designer with additional manual tasks needed to meet device area and speed constraints. Thus, the mapping method trades one error-prone manual task for another.

Practitioners have tried manually partitioning the technology-independent model into sections that are independently processed by a logic synthesizer. When a change is then made in the technology-independent model, only those partitions affected by the change need be resynthesized. However, the economy achieved by such manual partitioning is limited. If the partitions are small, they become difficult to manage, and a number of them may need to be changed. If they are large, any small change requires resynthesis of a large piece of logic, consuming inordinate time.

In U.S. Pat. No. 4,612,618, Richard L. Pryor, et al discusses a hierarchical technique for designing logic from the bottom up. They use repeated synthesis, first building a basic set of logical cells and then connecting these basic cells to form increasingly complex logic assemblies. Pryor, et al teach a form of logical partitioning, employing automated computer-aided techniques. While their partitioning method can limit the scope of logic revisions at the device-specific engineering level, they do not suggest how to select optimal partitioning in every situation.

A need thus exists in the art for a logic synthesis system that, having already once translated an earlier technology-independent model to technology-dependent form, can resynthesize an amended version of that technology-independent model to provide only the minimally necessary changes to the technology-dependent model. A logic synthesis system that functions in this fashion is generally denominated an "incremental" logic synthesis system.

In U.S. Pat. No. 4,882,690, Shinsha, et al discloses an incremental logic synthesis system. Their system performs a second synthesis of the entire amended technology-independent model and then compares the old and new technology-dependent models. The second synthesis is costly because it is applied to the full model. Also, sophisticated synthesis procedures that can delete signals may propagate a small change to the technology-independent model into major changes in the resulting technology-dependent model. In such case, later comparison of old and new technology-dependent versions reveals more changes than were made to the original technology-independent model. Shinsha, et al do not offer a method that preserves as much existing device-specific design work as possible without multiplying logical revisions into larger numbers of circuit changes.

In U.S. Pat. No. 5,003,487, Anthony E. Drumre, et al discloses a technique for correcting timing problems early in the logic synthesis process, thereby minimizing the effort otherwise later required. The problem solved by Drumm, et al is an example of why the simple incremental logic synthesis method of Shinsha, et al is not generally productive.

The Shinsha, et al incremental synthesis technique requires resynthesis of the entire logic model upon any modification however slight. Their merge procedure for combining revisions with the original model precedes their resynthesis of the new model, inviting the undesirable propagation of global effects discussed above. Their incremental synthesis method is not practical for use with very complex logic designs because it relies heavily on logical structure, which may not survive a sophisticated logic synthesis process. The Shinsha, et al approach to incremental logic synthesis also relies on the use of a mapping system rather than a full logic synthesis system so movement of signals forward or backward in the logic can jeopardize their resynthesis strategy as can removal of redundant or unnecessary signals. Also, their verification procedure requires rigorous point-by-point comparison of both the original and revised models regardless of the size or scope of the change.

Accordingly, there is a clearly felt need in the art for a logic synthesis system that can limit resynthesis to the logic in the vicinity of a change, thereby preserving the larger portion of the final device-specific design information already developed from the original intermediate technology-specific model. The related unresolved problems and deficiencies are clearly felt in the art and are solved by this invention in the manner described below.

SUMMARY OF THE INVENTION

It is an object of this invention to perform incremental logic synthesis in a way that works with sophisticated synthesis procedures. It is a further object of this invention to perform incremental logic synthesis without resynthesizing the entire revised technology-independent model.

In accordance with the method of this invention, a revised technology-independent model ($M_{12}$) having one or more digital logic functions and a technology-dependent model ($M_{21}$) derived from an earlier unrevised version of the technology-independent model ($M_{11}$) are established as inputs for incremental synthesis. Both models $M_{21}$ and $M_{12}$ are assumed to have the same Boolean inputs and outputs at the "boundaries". Incremental logic synthesis is then performed in accordance with this invention to incorporate all technology-independent revisions ($M_{12} - M_{11}$) into the first technology-dependent model $M_{21}$ to create a new technology-dependent model ($M_{22}$) with the minimal number of actual circuit changes. The incremental logic synthesis process of this invention includes six procedures: exclusion, forward sweep, backward sweep, resynthesis, merge and cleanup. Some of these procedures may be applied iteratively.

In the exclusion procedure, a Boolean comparison is performed to identify outputs in $M_{21}$ representing functions of inputs that are identical to the same outputs in $M_{12}$ using any useful equivalence checking means known in the art. Any logic that affects only such unchanged outputs is then deleted from the technology-independent model $M_{12}$.

In the forward sweep procedure, selected nodes in both $M_{21}$ and $M_{12}$ are compared to see if they represent identical functions of the inputs. A first list of such corresponding node pairs is made. All digital logic functions and inputs mapping only into such nodes are then eliminated from the technology-independent model $M_{12}$ and the nodes are relabeled as new inputs.

Similarly, in the backward sweep procedure, selected nodes in both $M_{21}$ and $M_{12}$ are compared to see if they appear only in outputs representing identical functions of nodes and inputs. A second list of such corresponding node pairs is made. In the technology-independent model $M_{12}$, the nodes appearing in pairs on the second list are relabeled as new outputs. All digital logic functions mapping only to such nodes and all outputs that represent functions only of such nodes are then eliminated from the technology-independent model $M_{12}$.

In both the forward and backward sweep procedures, nodes whose corresponding functions are identical except for a complementary operator are also swept into the elimination group but marked as complementary so that the appropriate inverters can be inserted during the later merge procedure.

During the resynthesis procedure, the portions of the revised technology-independent model $M_{12}$ remaining after the exclusion and sweep procedures are synthesized to produce a technology-dependent model "increment".

In the merge procedure, this new technology-dependent increment ($M_{22} - M_{21}$) is spliced into the original technology-dependent model $M_{21}$ to create the revised technology-dependent model $M_{22}$.

In the cleanup procedure, redundant logic is eliminated from the revised model $M_{22}$ and some final adjustments are made to ensure that technology rules are obeyed.

In a further aspect of this invention, the forward sweep and backward sweep procedures may be iteratively applied to intermediate results of the resynthesis procedure to further bound the changed portion ($M_{22} - M_{21}$) of the new technology-dependent model $M_{22}$.

The foregoing, together with other objects, features and advantages of this invention, will become more apparent when referring to the following specifications, claims and the accompanying drawing.

BRIEF DESCRIPTION OF THE DRAWING

For a more complete understanding of this invention, reference is now made to the following detailed description of the embodiments as illustrated in the accompanying drawing, wherein.

DETAILED DESCRIPTION OF THE PREFERRED EMBODIMENTS

Figure 1:
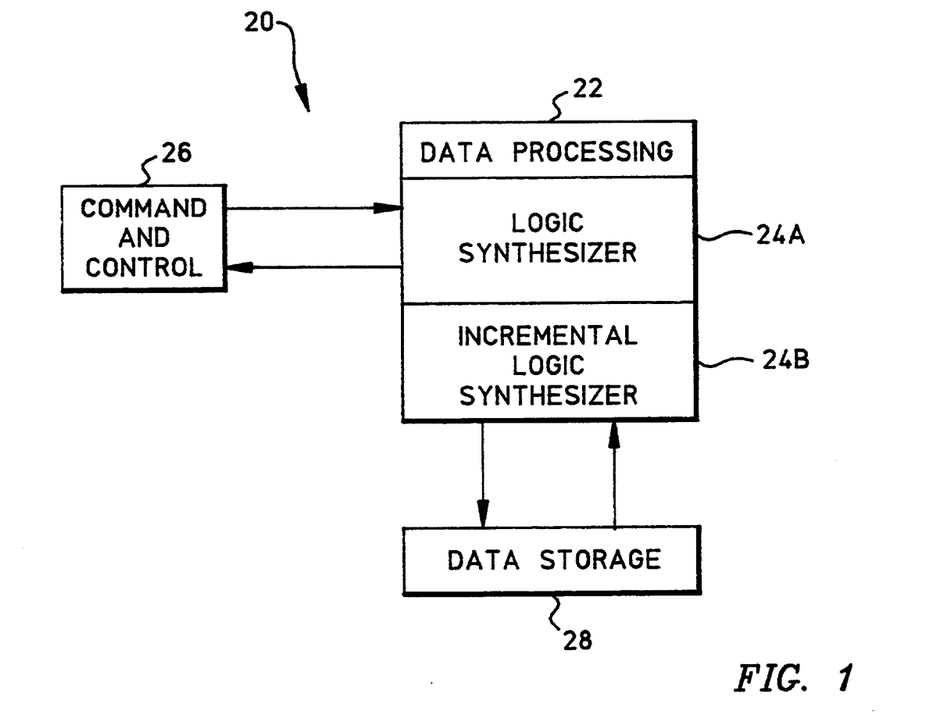
FIG. 1 is a functional block diagram illustrating a digital electronic system for performing incremental logic synthesis in accordance with this invention.

Referring now to FIG. 1, a digital electronic system 20 may include a conventional data processing apparatus 22 programmed to perform the functions of a logic synthesizer 24A and an incremental logic synthesizer 24B. Logic synthesizer 24A may be configured in accordance with the disclosure of the above-cited U.S. Pat. No. 4,703,435, or in any other useful manner. Data processing apparatus 22 receives input from and provides output to a command and control system 26. Command and control system 26 may conventionally include a keyboard and a mouse device (not shown) for generating user input, and a CRT display (not shown) for presenting visual user output. Data processing apparatus 24 communicates with a data storage device 28 containing programs and data for performing operations in accordance with this invention.

Figure 2:
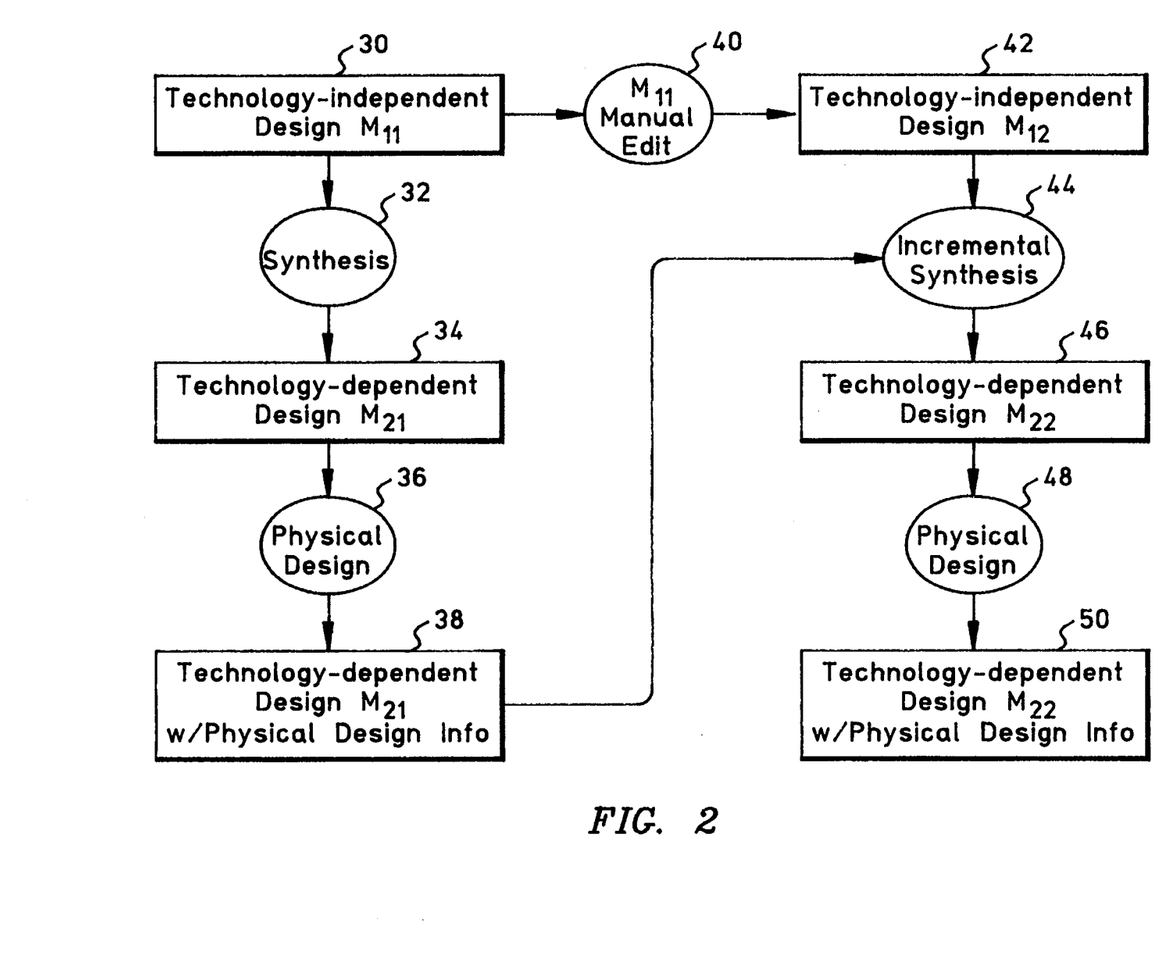
FIG. 2 is a flow diagram illustrating a design sequence that incorporates incremental synthesis in accordance with this invention.

FIG. 2 shows the incremental design procedure of this invention for digital electronic system 20. In a first step 30, a technology-independent (TI) design (model $M_{11}$) is developed by a designer. It includes one or more digital logic "functions" or components mapped together by a interconnection of inputs and outputs. In a second step 32, a non-incremental synthesis system such as logic synthesizer 24A converts model $M_{11}$ into a technology-dependent (TD) design model $M_{21}$, a representation of which may be stored in a third step 34 to data storage device 28. In a fourth step 36, further physical design work is done, encompassing such things as layout and timing verification, producing an augmented TD design model $M_{21}$ with the physical design information attached thereto. This augmented model $M_{21}$ may be stored at a fifth step 38.

The designer makes a change to the TI design model $M_{11}$ in step 40 to produce a revised TI design model $M_{12}$, which is stored at step 42. This revision may be to fix a bug or to enhance the function of the system. In step 44, the revised TI design model $M_{12}$ is presented to an incremental logic synthesis system such as incremental logic synthesizer 24B, which operates on existing TD design model $M_{21}$ and the revised TI design model $M_{12}$ to produce a revised TD design model $M_{22}$, stored in step 46. Model $M_{22}$ is then subject to physical design in step 48 to produce an augmented revised TD design model $M_{22}$ with the physical design information attached thereto and stored at step 50. The closer that revised TD design model $M_{22}$ is to the original TD design model $M_{21}$, the less physical design work is needed at step 48.

Figure 3:
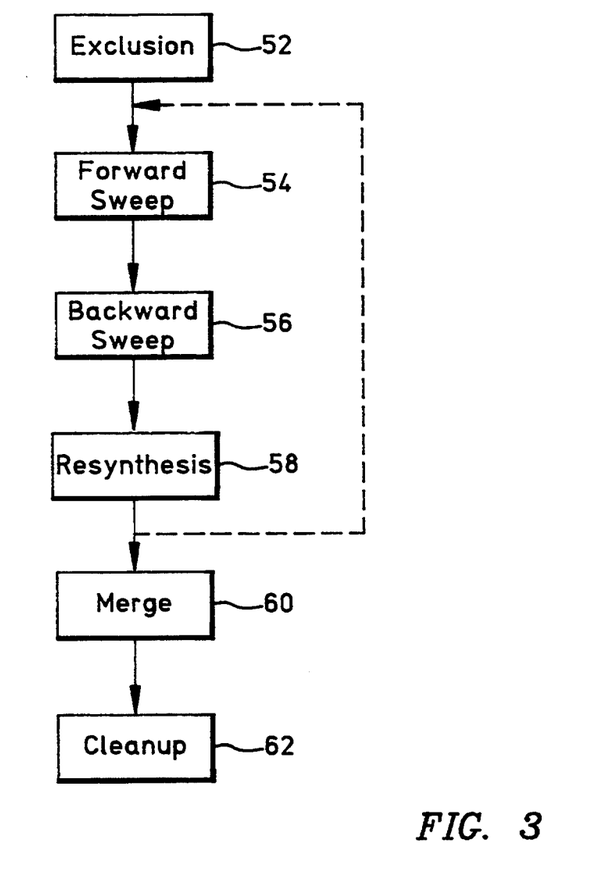
FIG. 3 is a flow diagram illustrating a preferred incremental logic synthesis method in accordance with this invention.

FIG. 3 depicts the major steps involved in a preferred embodiment of the incremental logic synthesis method of this invention: exclusion step 52, forward sweep step 54, backward sweep step 56, resynthesis step 58, merge step 60, and cleanup step 62. The dashed line in FIG. 3 indicates that forward sweep step 54, backward sweep step 56, and resynthesis step 58 may be repeated a number of times to further bound the amount of logic that is changed.

Steps 52–62 of the preferred incremental logic synthesis method will now described in greater detail. Their operation on a simple pair of TI and TD designs shown in FIGS. 4 and 5 is also described.

Figure 4:
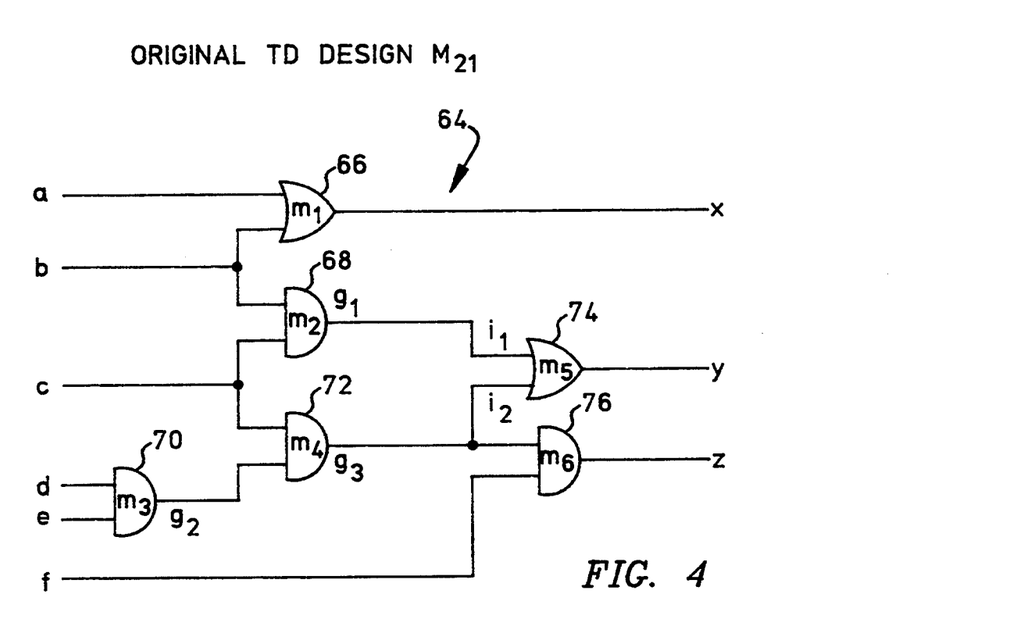
FIG. 4 is a logic diagram illustrating a technology-dependent design model $M_{21}$.
Figure 5:
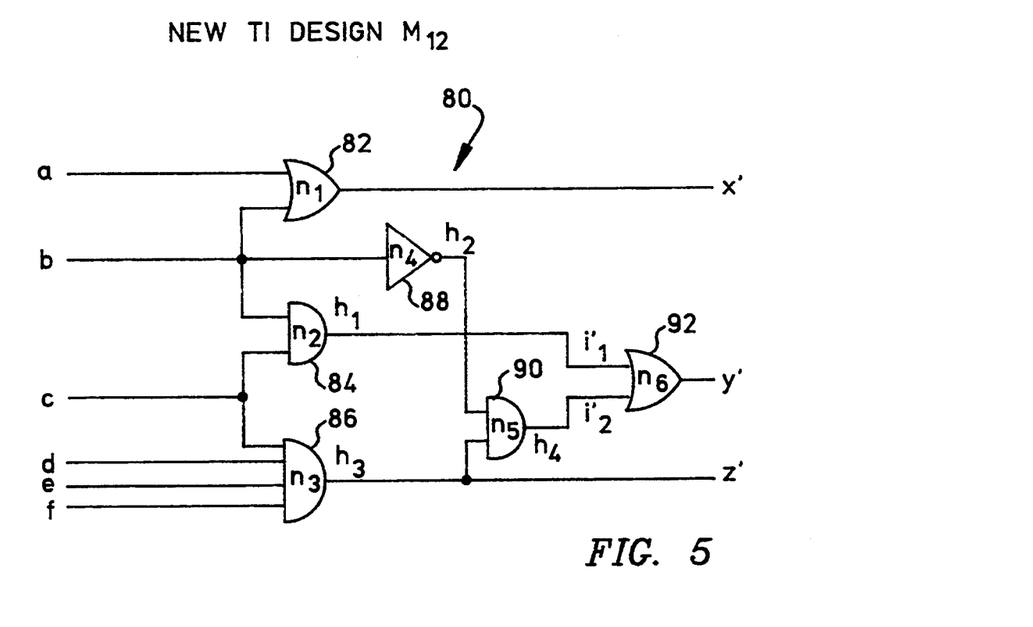
FIG. 5 is a logic diagram illustrating a technology-independent form $M_{11}$ of the model $M_{21}$ of FIG. 4.

In FIG. 4, an old TD design 64 comprises a number of inputs {a, b, c, d, e, f} and a number of outputs {x, y, z}. TD design 64 also includes the digital logic functions {66, 68, 70, 72, 74, 76}. Similarly, in FIG. 5, a new TI design 80 has inputs {a, b, c, d, e, f}, which are in one-to-one correspondence with inputs {a, b, c, d, e, f} of old TD design 64, and outputs {x', y', z'}, which are in one-to-one correspondence with outputs {x, y, z} of old TD design 64. New TI design 80 also includes digital logic functions {82, 84, 86, 88, 90, 92}.

In old TD design 64, intermediate outputs {$g_1$, $g_2$, $g_3$} are produced by digital logic functions 68, 70 and 72, respectively. The relationship between inputs and outputs in old TD design 64 is as follows:

| | |
|---|---|
| $g_1 = bc$ | $x = ab$ |
| $g_2 = de$ | $y = g_1 + g_3 = bc + cde$ |
| $g_3 = cg_2 = cde$ | $z = g_3 f = cdef$ |

In the new TI design 80, intermediate outputs {$h_1$, $h_2$, $h_3$, $h_4$} are produced by logic components 84, 88, 86 and 90, respectively. The relationship between inputs and outputs in the new TI design 80 is as follows:

| | |
|---|---|
| $h_1 = bc$ | $x' = ab$ |
| $h_2 = \bar{b}$ | $y' = h_1 + h_4 = bc + \bar{b}cdef$ |
| $h_3 = cdef$ | $z' = h_3 = cdef$ |
| $h_4 = h_2 h_3 = \bar{b}cdef$ | |

In exclusion step 40 of incremental synthesis, old TD ($M_{21}$) design 64 and new TI ($M_{12}$) design 80 are compared and the outputs that are identical functions of the inputs in the two designs are identified. Digital logic functions and inputs in the TI design 80 that drive only those outputs are then excluded. To determine which outputs are unchanged functions of the inputs, exclusion step 52 uses a conventional Boolean comparison procedure. See, for example, one of the procedures described by G. L. Smith, et al in "Boolean Comparison of Hardware and Flowcharts,", *IBM Journal of Research and Development*, Vol. 26, No. 1, pp. 106–116 (1982). See also Drumm's copending patent application "Engineering Change Management System Employing A Smart Editor" (Assignee Docket No. EN9-92-084) filed on Feb. 9, 1993 as U.S. patent application Ser. No. 08/015,401, entirely incorporated herein by this reference. If each output maps to the same function of inputs in both $M_{12}$ and $M_{21}$, incremental logic synthesis stops because TD design $M_{21}$ is functionally identical to TI design $M_{12}$ and there is no need to change the TD design to create the model $M_{22}$ sought.

Considering TD design 64 and TI design 80 of FIGS. 4 and 5, the following comparisons are noted:

$x' = x \in$ output group
$z' = z \in$ output group
$y' \neq y \notin$ output group To complete exclusion step 52, conventional techniques are employed for each digital logic function (component) to determine the outputs into which the function feeds. The group of such outputs may be represented by a bit vector. Exclusion step 52 then excludes from the TI design $M_{12}$ any logic that does not map into any of the members of the "identical" output group.

Figure 6:
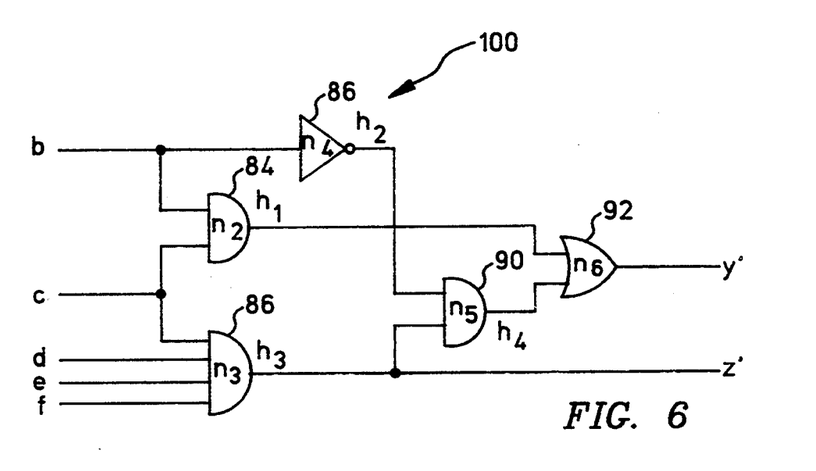
FIG. 6 is a logic diagram illustrating the technology-independent model $M_{11}$ of FIG. 5 with an area eliminated by an exclusion procedure of this invention.

FIG. 6 shows the outcome of the exclusion process for the designs of FIGS. 4 and 5. While output x of FIG. 4 is the same function of inputs as output x' of FIG. 5, and output z of FIG. 4 is the same function of inputs as output z' of FIG. 5, outputs y and y' of FIGS. 4 and 5 are different functions of the inputs. The method therefore assigns to the "output group" and thereby excludes from the TI design any digital logic functions that map to (affect) only outputs x' and z', but not those mapping to output y'. In this example, logic component 82 feeds solely into output x' and may be excluded. Input "a" feeds solely into digital logic function 82 and may also be excluded. Logic component 88 feeds into output z' but also feeds into logic component 90, thus affecting output y'. Logic component 88 therefore cannot be excluded. Likewise, input "b" feeds into logic component 82 but also feeds into logic component 86, so input "b" cannot be excluded. The set of digital logic functions and inputs that remain in TI design 80 following exclusion procedure 52 is seen to be precisely that shown in FIG. 6, which represents a new TI design 100.

Forward sweep procedure 54 of incremental logic synthesis starts by selecting the forward sweep group of node pairs and scanning for equivalent logical function from inputs to outputs. This is a group of pairs of nodes, one in the TI design $M_{12}$ and one in the TD design $M_{21}$, such that both nodes in each pair represent the same Boolean function of the designs' common inputs. The selection of the forward sweep group may be exact in the sense that all such pairs are included in the set, or inexact in the sense that not all such pairs are included because finding all pairs would consume too much computational time.

In a preferred embodiment of the invention, the forward sweep group is identified by a procedure that begins by labeling each node of both designs with a bit vector that represents the set of inputs that directly or indirectly feed into that node. Once the labels are in place, all pairs of nodes from both designs are considered. Pairs having the same bit vector label are presented to any conventional Boolean comparison process such as described by the Smith, et al and Drumm references cited hereinabove.

The Boolean comparison process preferably starts by simulating the TI and TD designs with a small set of random input bit vectors and comparing the resulting Boolean values on the nodes in the pair, so as to rapidly eliminate many candidate pairs of nodes. The running time of the Boolean comparison procedure may be limited, in which case pairs of nodes that are not found to represent the same logical function within a predetermined amount of time are not placed in the forward sweep group. The procedure must also flag situations where one node of a pair represents the simple complement of the function represented by the other. This may be conveniently accomplished by simulating the designs once, then discovering whether the Boolean values of each node pair are the same or opposite, and, if opposite, running the conventional Boolean comparison procedure for the Boolean function of inputs to one node with the complement of the inputs to the other node.

Once the forward sweep group is identified, the TI design nodes in the group are added as new inputs to the TI design $M_{12}$, and any digital logic components and inputs mapping only into such new inputs are eliminated from the TI design $M_{12}$. Such components and inputs may be identified by any useful conventional comparison technique, as with the above-described exclusion phase.

The elimination and Boolean comparison steps may be interleaved during the forward sweep so that as soon as a node pair is identified, resulting eliminations are immediately made. Because the elimination step tends to simplify the TI logic, it should reduce the compute time of subsequent Boolean comparison steps.

Figure 7:
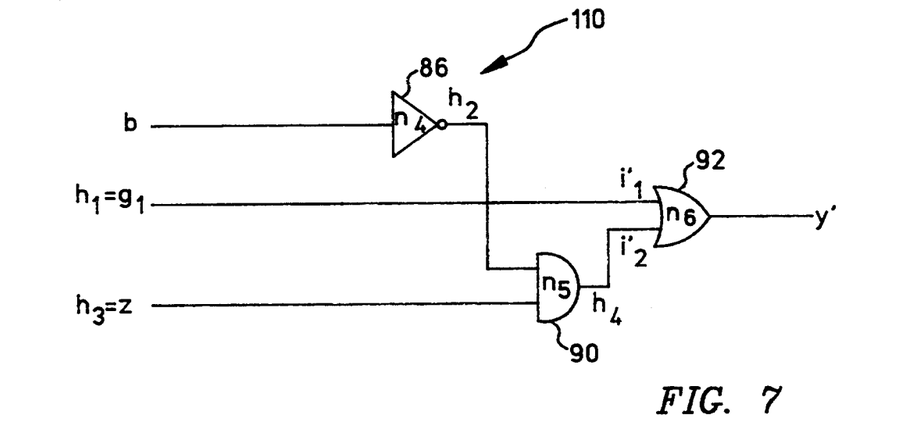
FIG. 7 is a logic diagram illustrating the partial technology-independent model of FIG. 6 with an additional area eliminated by a forward sweep procedure of this invention.

FIG. 7 shows the outcome of forward sweep procedure 54 for the designs of FIGS. 4 and 5. The following equivalencies between these designs are found to be as follows:

$h_1 = g_1$ $h_3 = z$

Using these nodes as new inputs and removing identical outputs, a new TI design 110 is produced and is shown in FIG. 7.

Backward sweep procedure 56 starts by selecting the backward sweep group of node pairs and scanning for equivalent logic from outputs to inputs. This group contains pairs of nodes, one from each of the two designs. Each node pair is selected such that all corresponding outputs in each design have the same Boolean function of inputs and of the corresponding pair nodes. As with the forward sweep procedure, the selection of this set may be exact in the sense that all pairs of nodes satisfying this condition are identified, or inexact in that some pairs are not identified because identifying them takes too much time.

In a preferred embodiment of backward sweep procedure 56, every node is labeled with a bit vector representing the set of outputs to which it maps. All node pairs in both $M_{12}$ and $M_{21}$ are considered. If both nodes in a pair have the same bit vector, then a conventional Boolean comparison system is invoked to determine if the pair meet the required condition for membership in the backward sweep group. Such a comparison system should preferably start by simulating the designs with some input bit vectors to make a quick check of whether the outputs are the same before proceeding to use more elaborate techniques (e.g., see the Drumm reference cited hereinabove).

After the node pairs for the backward sweep group are selected, the $M_{12}$ nodes in the set are made new outputs of the $M_{12}$ system. All digital logic functions mapping from only such nodes and from inputs and all outputs mapping from only such nodes and from inputs are identified and eliminated from the TI design $M_{12}$ by any useful conventional means. As with forward sweep procedure 54, elimination and pair identification operations may be interleaved.

Figure 8:
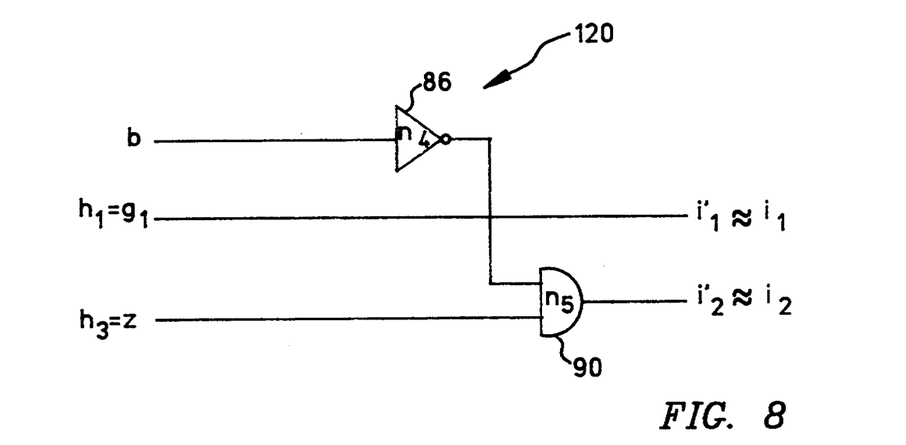
FIG. 8 is a logic diagram illustrating the partial technology-independent model of FIG. 7 with an additional area eliminated by a backward sweep procedure of this invention.

FIG. 8 shows the outcome of backward sweep procedure 56 on TI design 110 of FIG. 7, producing a new TI design 120. Using a conventional structural comparison, it is found that the digital logic functions 74 and 92 feeding y and y', respectively, are both 2-way OR gates. The inputs i'$_1$ and i'$_2$ to function 92 in TI design 110 may thus be considered outputs corresponding to inputs i$_1$ and i$_2$ to function 74 of TD design 64. This allows removal of function 92 from TI design 110 to give the new TI design 120 shown in FIG. 8.

In resynthesis procedure 58, a conventional non-incremental logic synthesis procedure is applied to whatever remains of the original TI design 80 to generate a corresponding TD design. That is new TI design 120. In the example in FIGS. 4 and 5, it is assumed that conventional synthesis produces a TD design that is identical to TI design 120 shown in FIG. 8.

A conventional logic synthesis system transforms its TI input model $M_{12}$ into successive equivalent designs until it reaches a final TD design model $M_{22}$. The forward sweep procedure 54 and backward sweep procedure 56 may be applied to such an intermediate version of the TI design to further reduce it.

Finally, a merge of the new TD design increment 120 and the old TD design 64 is performed in the merge procedure 60. All nodes in old TD design 64 that either (1) are outputs found to implement different functions (i.e., not members of the "output group") in exclusion procedure 52 and not eliminated in the backward sweep (i.e., not members of the backward sweep group) are disconnected from the logic components that drive them. The corresponding nodes in the new TD design, as determined by matching according to the backward sweep group of node pairs, are then connected to drive those nodes or outputs. Inputs of the new TD design are also connected to the corresponding nodes of the old TD design. If any of the node pairs were marked as complementary during the forward or backward sweeps, suitable inverters are inserted during the merge.

Figure 9:
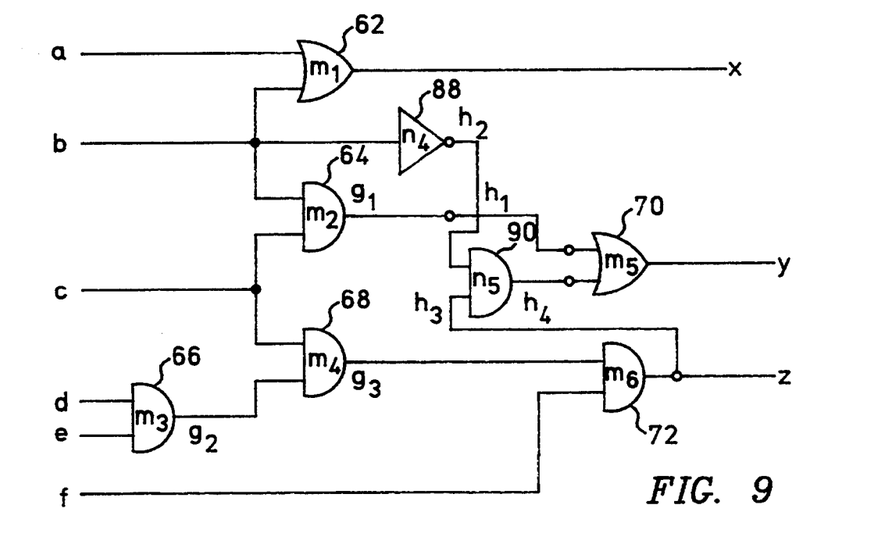
FIG. 9 is a logic diagram illustrating the technology-dependent model $M_{21}$ of FIG. 4 after splicing in the technology-dependent increment synthesized from the partial technology-independent model of FIG. 8 in accordance with a merge procedure of this invention.

FIG. 9 depicts the result of performing a merge of the new TD design (i.e., as shown in FIG. 8) with the old TD design 64 of FIG. 4. The old TD design 64 is disconnected at the points equivalent to i'$_1$ and i'$_2$, which are i$_1$ and i$_2$. The inputs and outputs of new TD design 120 are then connected to the equivalent points in old TD design 64. It will be seen from inspection that the function of y in the old TD design 64 has been changed to that of y', as follows:

$$y = g_1 + h_4 = g_1 + h_2 z = bc + \overline{b}cdef = y'$$

Cleanup procedure 62 of the incremental logic synthesis method of this invention eliminates digital logic functions that are no longer necessary in the merged TD design $M_{22}$. Means for performing such elimination are part of conventional logic synthesis systems such as that disclosed in the Darringer, et al reference cited hereinabove. Cleanup procedure 62 may also make those changes necessary to restore any technology constraints that may have been violated by the merge. In particular, merge procedure 62 may introduce fan-outs that exceed technology limits, requiring corrective changes. Such changes are carried out by any useful means such as are available in typical logic synthesis systems.

In the example of FIGS. 4 and 5, the network is resynthesized with the restriction that functions that are technology-mapped (i.e., 66–76) should be left as is, if possible. Optimization of the logic resulting from this synthesis process would uncover the logical identity:

$$bc + \overline{b}cdef = bc + cdef$$

Figure 10:
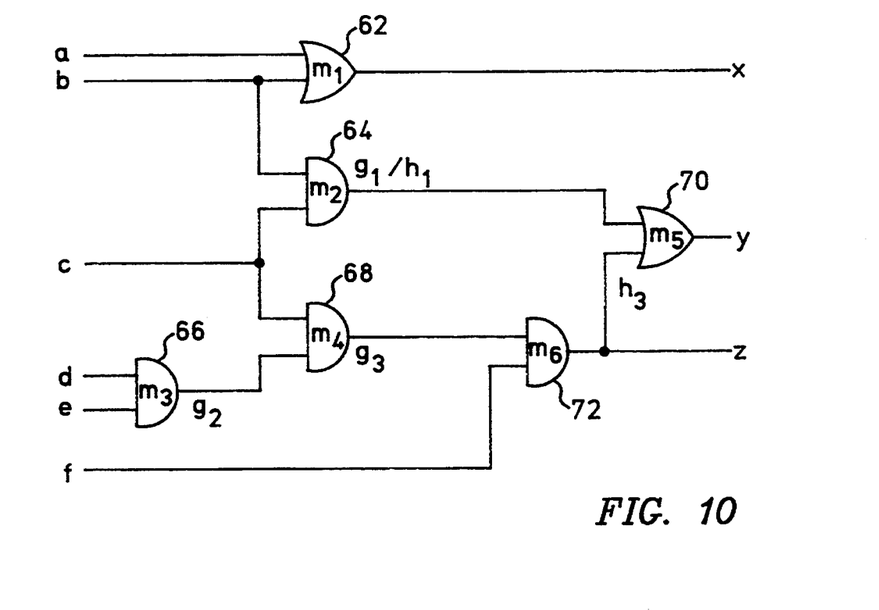
FIG. 10 is a logic diagram illustrating the incremental technology-dependent model $M_{22}$ of FIG. 9 following a cleanup procedure of this invention.

Blocks 86 and 90 could then be removed. The final logic network could then be as shown in FIG. 10.

Accordingly, a method and apparatus for incremental logic synthesis have been disclosed. Although various embodiments of the invention have been shown and described, it is understood that various modifications and adaptations thereof are likely to occur to those skilled in the art. The invention, therefore, is not limited except in accordance with the spirit of the following claims and their equivalents.

I claim:

1. A method for performing incremental logic synthesis of a revised technology-dependent digital circuit design model $M_{22}$ from a revised technology-independent digital circuit design model $M_{12}$ and an unrevised technology-dependent digital circuit design model $M_{21}$, each said model including one or more digital logic functions having one or more inputs and one or more outputs, each said model having one or more boundary nodes to each of which are mapped one or more of said inputs and outputs, said models $M_{12}$ and $M_{21}$ sharing a first set of one or more said boundary nodes designated as Boolean inputs and a second set of one or more said boundary nodes designated as Boolean outputs, said method comprising the computer-executable steps of:

(a) performing one or more steps from a group consisting essentially of the following three unordered steps of:

(a.1) performing an exclusion procedure including the ordered steps of (a.1.1) selecting one or more of said Boolean outputs to form an output group such that the logical function of said Boolean inputs in said model $M_{21}$ represented by each member of said output group is identical to the logical function of said Boolean inputs in said model $M_{12}$ represented by said each member, and (a.1.2) deleting from said revised technology-independent design model $M_{12}$ each said digital logic function and each said input that maps only into said output group;

(a.2) performing one or more times a forward sweep procedure including the ordered steps of (a.2.1) selecting one or more first pairs of said nodes to form a forward sweep group such that each said first node pair includes a first node in said model $M_{12}$ and a second node in said model $M_{21}$ where said first and second nodes represent identical logical functions of said Boolean inputs except for complimentary operators, (a.2.2) redesignating as new inputs in said revised technology-independent design model $M_{12}$ each said first node member of said forward sweep group, and (a.2.3) deleting from said revised technology-independent design model $M_{12}$ each said digital logic function and each said input that maps only into said new inputs;

(a.3) performing one or more times a backward sweep procedure including the ordered steps of (a.3.1) selecting one or more second pairs of said nodes to form a backward sweep group such that each said second node pair includes a third node in said model $M_{12}$ and a fourth node in said model $M_{21}$ where each said Boolean output represents a logical function of said third nodes and said Boolean inputs in said model $M_{12}$ that is identical to the logical function of said fourth nodes and said Boolean inputs in said model $M_{21}$ at said each Boolean output except for complimentary operators, (a.3.2) redesignating as new outputs in said revised technology-independent design model $M_{12}$ each said third node member of said backward sweep group, and (a.3.3) deleting from said revised technology-independent design model $M_{12}$ each said digital logic function and each said output to which are mapped only said new outputs;

(b) synthesizing a new technology-dependent design model increment having a logical function equivalent to the portion of said model $M_{12}$ remaining after completion of said performing step (a); and (c) merging said new technology-dependent design model increment with said unrevised technology-dependent design model $M_{21}$ to form said revised technology-dependent design model $M_{22}$.

2. The method of claim 1 wherein said performing step (a) is applied to said remaining portion of model $M_{12}$ and said new technology-dependent design model increment from said synthesizing step (b).

3. The method of claim 2 wherein said merging step (c) comprises the ordered steps of:

(c.1) disconnecting from the digital logic functions in said unrevised technology-dependent design model $M_{21}$ each said node belonging to said output group from said performing step (a.1) and each said node belonging to said backward sweep group from said performing step (a.3);

(c.2) connecting each input in said new technology-dependent design model increment to the node in said unrevised technology-dependent design model $M_{21}$ that is paired to said each input in said forward sweep group; and (c.3) connecting each output in said new technology-dependent design model increment to a node in said unrevised technology-dependent design model $M_{21}$ that is paired to said each output in said backward sweep set.

4. The method of claim 3 wherein said selecting step (a.2.1) comprises the ordered steps of:

(a.2.1.1.) labeling each said node of said models $M_{21}$ and $M_{12}$ with a first bit vector representing the set of said inputs mapped to said each node;

(a.2.1.2) selecting one or more third pairs of said nodes having identical said first bit vectors, such that each said third node pair includes one said node from said model $M_{12}$ and one said node from model $M_{21}$; and (a.2.1.3) selecting said forward sweep group from said one or more third node pairs.

5. The method of claim 4 wherein said selecting step (c.1) comprises the ordered steps of:

(a.3.1.1) labeling each said node of said models $M_{12}$ and $M_{21}$ with a second bit vector representing the set of said outputs into which said each node is mapped;

(a.3.1.2) selecting one or more fourth pairs of said nodes having identical said second bit vectors, such that each said third node pair includes one said node from said model $M_{12}$ and one said node from said model $M_{21}$; and (a.3.1.3) selecting said backward sweep group from said one or more fourth node pairs.

6. The method of claim 1 wherein said merging step (c) comprises the ordered steps of:

(c.1) disconnecting from the digital logic functions in said unrevised technology-dependent design model $M_{21}$ each said node belonging to said output group from said performing step (a.1) and each said node belonging to said backward sweep group from said performing step (a.3);

(c.2) connecting each input in said new technology-dependent design model increment to the node in said unrevised technology-dependent design model $M_{21}$ that is paired to said each input in said forward sweep group; and (c.3) connecting each output in said new technology-dependent design model increment to a node in said unrevised technology-dependent design model $M_{21}$ that is paired to said each output in said backward sweep set.

7. The method of claim 1 wherein said selecting step (a.2.1) comprises the ordered steps of:

(a.2.1.1) labeling each said node of said models $M_{21}$ and $M_{12}$ with a first bit vector representing the set of said inputs mapped to said each node;

(a.2.1.2) selecting one or more third pairs of said nodes having identical said first bit vectors, such that each said third node pair includes one said node from said model $M_{12}$ and one said node from model $M_{21}$; and (a.2.1.3) selecting said forward sweep group from said one or more third node pairs.

8. The method of claim 1 wherein said selecting step (a.3.1) comprises the ordered steps of:

(a.3.1.1) labeling each said node of said models $M_{12}$ and $M_{21}$ with a second bit vector representing the set of said outputs into which said each node is mapped;

(a.3.1.2) selecting one or more fourth pairs of said nodes having identical said second bit vectors, such that each said third node pair includes one said node from said model $M_{12}$ and one said node from said model $M_{21}$; and (a.3.1.3) selecting said backward sweep group from said one or more fourth node pairs.

9. A system for performing incremental logic synthesis of a revised technology-dependent digital circuit design model $M_{22}$ from a revised technology-independent digital circuit design model $M_{12}$ and an unrevised technology-dependent digital circuit design model $M_{21}$, each said model including one or more digital logic functions having one or more inputs and one or more outputs, each said model having one or more boundary nodes to each of which are mapped one or more of said inputs and outputs, said models $M_{12}$ and $M_{21}$ sharing a first set of one or more said boundary nodes designated as Boolean inputs and a second set of one or more said boundary nodes designated as Boolean outputs, said system comprising:

reduction means for identifying and limiting the revision of said model $M_{21}$ needed to obtain said model $M_{22}$, said reduction means including one or more elements from a group consisting essentially of exclusion means, forward sweep means and backward sweep means, said exclusion means including first selection means for selecting one or more of said Boolean outputs to form an output group such that the logical function of said Boolean inputs in said model $M_{21}$ represented by each member of said output group is identical to the logical function of said Boolean inputs in said model $M_{12}$ represented by said each member, and first deletion means for deleting from said revised technology-independent design model $M_{12}$ each said digital logic function and each said input that maps only into said output group, said forward sweep means including second selection means for selecting one or more first pairs of said nodes to form a forward sweep group such that each said first node pair includes a first node in said model $M_{12}$ and a second node in said model $M_{21}$ where said first and second nodes represent identical logical functions of said Boolean inputs except for one or more complimentary operators, first deletion means for redesignating as new inputs in said revised technology-independent design model $M_{12}$ each said first node member of said forward sweep group, and second deletion means for deleting from said revised technology-independent design model $M_{12}$ each said digital logic function and each said input that maps only into said new inputs, and said backward sweep means including third selection means for selecting one or more second pairs of said nodes to form a backward sweep group such that each said second node pair includes a third node in said model $M_{12}$ and a fourth node in said model $M_{21}$ where each said Boolean output represents a logical function of said third nodes and said Boolean inputs in said model $M_{12}$ that is identical to the logical function of said fourth nodes and said Boolean inputs in said model $M_{21}$ at said each Boolean output except for complimentary operators, second designation means for redesignating as new outputs in said revised technology-independent design model $M_{12}$ each said third node member of said backward sweep group, and third deletion means for deleting from said revised technology-independent design model $M_{12}$ each said digital logic function and each said output to which only said new outputs are mapped;

logic synthesis means for producing a new technology-dependent design model increment having a logical function equivalent to the portion of said model $M_{12}$ remaining after any operation of said reduction means; and merger means for merging said new technology-dependent design model increment with said unrevised technology-dependent design model $M_{21}$ to form said revised technology-dependent design model $M_{22}$.

10. The method of claim 9 wherein said merger means comprises:

disconnection means for disconnecting from the digital logic functions in said unrevised technology-dependent design model $M_{21}$ each said node belonging to said output group and each said node belonging to said backward sweep group;

first connection means for connecting each input in said new technology-dependent design model increment to the node in said unrevised technology-dependent design model $M_{21}$ that is paired to said each input in said forward sweep group; and said connection means for connecting each output in said new technology-dependent design model increment to a node in said unrevised technology-dependent design model $M_{21}$ that is paired to said each output in said backward sweep set.

11. The method of claim 9 wherein said second selection means comprises:

labeling means for labeling each said node of said models $M_{21}$ and $M_{12}$ with a first bit vector representing the set of said inputs mapped to said each node;

fourth selection means for selecting one or more third pairs of said nodes having identical said first bit vectors, such that each said third node pair includes one said node from said model $M_{12}$ and one said node from model $M_{21}$; and fifth selection means for selecting said forward sweep group from said one or more third node pairs.

12. The method of claim 9 wherein said third selection means comprises:

labeling means for labeling each said node of said models $M_{12}$ and $M_{21}$ with a second bit vector representing the set of said outputs into which said each node is mapped;

fourth selection means for selecting one or more fourth pairs of said nodes having identical said second bit vectors, such that each said third node pair includes one said node from said model $M_{12}$ and one said node from said model $M_{21}$; and fifth selection means for selecting said backward sweep group from said one or more fourth node pairs.

\* \* \* \* \*